United States Patent
Sakamoto

(10) Patent No.: US 8,149,423 B2
(45) Date of Patent: Apr. 3, 2012

(54) POSITION DETECTION APPARATUS, EXPOSURE APPARATUS, AND METHOD OF MANUFACTURING DEVICE

(75) Inventor: Noritoshi Sakamoto, Shimotsuga-gun (JP)

(73) Assignee: Canon Kabushiki Kaisha (JP)

( * ) Notice: Subject to any disclaimer, the term of this patent is extended or adjusted under 35 U.S.C. 154(b) by 189 days.

(21) Appl. No.: 12/729,515

(22) Filed: Mar. 23, 2010

(65) Prior Publication Data

US 2010/0245848 A1     Sep. 30, 2010

(30) Foreign Application Priority Data

Mar. 24, 2009 (JP) ................. 2009-072863

(51) Int. Cl.
*G01N 21/55* (2006.01)
(52) U.S. Cl. ...................... 356/620; 356/614
(58) Field of Classification Search ........... 356/614–625
See application file for complete search history.

(56) References Cited

U.S. PATENT DOCUMENTS

| 2005/0002020 A1* | 1/2005 | Inoue et al. ................. 356/237.1 |
| 2005/0002035 A1 | 1/2005 | Mishima |

FOREIGN PATENT DOCUMENTS

| JP | 10-022211 A | 1/1998 |
| JP | 2003-142375 A | 5/2003 |
| JP | 2004-279166 A | 10/2004 |
| JP | 2004-356193 A | 12/2004 |
| JP | 2005-026461 A | 1/2005 |

* cited by examiner

*Primary Examiner* — Michael P Stafira
(74) *Attorney, Agent, or Firm* — Rossi, Kimms & McDowell LLP

(57) ABSTRACT

A position detection apparatus includes an imaging system, an illumination system including a rotary table having first and second aperture stops, both of which can be positioned on the pupil plane of the illumination system, a first image sensor that detects the image of the mark formed by the imaging system, a second image sensor that senses an image of the aperture stop for the imaging system and that of the first aperture stop, and a controller. The controller corrects the first aperture stop so as to reduce the adverse influence of a displacement of the first aperture stop, based on sensed images of the aperture stop for the imaging system and the first aperture stop. Based on the detected position of the image of the mark, the apparatus detects the position of an object to be detected using the illumination light having passed through the corrected first aperture stop.

6 Claims, 9 Drawing Sheets

POSITION DETECTION APPARATUS, EXPOSURE APPARATUS, AND METHOD OF MANUFACTURING DEVICE

BACKGROUND OF THE INVENTION

1. Field of the Invention

The present invention relates to a position detection apparatus, an exposure apparatus, and a method of manufacturing a device.

2. Description of the Related Art

In the conventional photolithography process in manufacturing, for example, a semiconductor device and a liquid crystal display device, a circuit pattern formed on a reticle or a mask (to be representatively referred to as a mask hereinafter) is transferred by exposure onto a semiconductor wafer or a glass substrate (to be representatively referred to as a wafer hereinafter) via a projection optical system.

One commonly used exposure apparatus is of the step & repeat type (this type is also sometimes referred to as a stepper) that sequentially transfers by exposure the pattern of a mask to a plurality of exposure regions via a projection optical system. Another commonly used exposure apparatus is of the step & scan type (this type is also sometimes referred to as a scanner or a scanning exposure apparatus) that repeats exposure in a plurality of regions on a substrate by repeating stepping movement and scanning exposure.

In recent years, the patterns of semiconductor devices and other devices are increasingly becoming finer. To attain this, it is necessary to increase the resolution of a projection optical system. To improve the resolution of an exposure apparatus, one method shortens the exposure wavelength, and another method increases the numerical aperture (NA) of a projection optical system.

As for the method of shortening the exposure wavelength, various kinds of light sources have been developed. For example, a shift from the i-line with a wavelength of 365 nm to KrF excimer laser light with an oscillation wavelength around 248 nm is in progress, and an ArF excimer laser with a shorter oscillation wavelength around 193 nm is under development. A fluorine ($F_2$) excimer laser with a further shorter oscillation wavelength around 157 nm is under development as well.

As for the method of increasing the numerical aperture (NA) of a projection optical system, an immersion exposure method is attracting a great deal of attention. In the immersion exposure method, a substrate (e.g., a wafer) is exposed while the space between the substrate and the final surface of a projection optical system, which is conventionally filled with a gas, is filled with a liquid. The immersion method has the advantage of improving the resolution compared to the conventional method even when a light source with the same wavelength as that of the conventional light source is used. Assume, for example, that the liquid supplied to the space between the projection optical system and the wafer is pure water (Refractive Index: 1.33), and the maximum incident angle of a light beam which forms an image on the wafer is the same between the immersion exposure method and the conventional method. In this case, since the NA of the projection optical system increases to 1.33 times, the resolution in the immersion exposure method is 1.33 times as high as that in the conventional method. In this manner, the immersion exposure method can obtain a resolution corresponding to the case of NA$\geq$1, which is impossible for the conventional method. To realize this immersion exposure method, various types of exposure apparatuses have been proposed.

To keep up with an improvement in resolution of projection patterns, it is also necessary to increase the accuracy of relative alignment between a wafer and a mask in an exposure apparatus.

An exposure apparatus is required not only to have a high resolution but also to function as a high-precision position detection apparatus. Under the circumstance, one frequently used wafer alignment scheme is an off-axis autoalignment detection system (to be simply referred to as an "OA detection system" hereinafter). The OA detection system is positioned at a position different from that of a projection optical system and detects the position of an alignment mark on a wafer without using the projection optical system. The wafer is aligned based on the obtained detection result.

One conventional alignment scheme is a method called TTL-AA (Through The Lens AutoAlignment). This method detects an alignment mark on a wafer using a non-exposure light component with an alignment wavelength via a projection optical system. The TTL-AA has the merit of requiring only small amounts of driving of a wafer stage both during alignment measurement and during exposure because a very short distance (so-called baseline) can be set between the optical axis of the projection optical system and that of the TTL-AA. This makes it possible to reduce measurement errors attributed to a fluctuation in the distance between the optical axis of the projection optical system and that of the TTL-AA in response to an environmental change in the vicinity of the wafer stage. In other words, the TTL-AA has the merit of suppressing a fluctuation in baseline.

However, a shift of the exposure light to light with a relatively short wavelength, such as KrF laser light or ArF laser light, leads to limitation of the type of usable glass material, and this makes it difficult to correct the chromatic aberration of the projection optical system for the alignment wavelength. Hence, an OA detection system that is free from the adverse influence of the chromatic aberration of a projection optical system is becoming important.

One alignment scheme described in Japanese Patent Laid-Open No. 2004-279166, which includes a conventional OA detection system, will be explained. FIG. 1 is a schematic view showing the arrangement of a conventional OA detection system.

In the OA detection system, light guided from a light source 1 passes through illumination relay optical systems 2 and 3 and forms an image in an aperture stop formed in a rotary table 4. Specific light having passed through the aperture stop further passes through an illumination optical system 5 and is guided to a polarizing beam splitter 6. S-polarized light reflected by the polarizing beam splitter 6 passes through a relay lens 7 and λ/4 plate 8, is converted into circularly polarized light, and Kohler-illuminates a wafer mark WM, formed on a wafer W, upon passing through an objective lens 9. Reflected light, diffracted light, and scattered light generated by the wafer mark WM travel back through the objective lens 9, λ/4 plate 8, and relay lens 7. The resultant light is then converted into P-polarized light, passes through the polarizing beam splitter 6, and forms an image of the wafer mark WM on a sensor (image sensor) 11 by an imaging optical system 10. The position of the wafer W is detected based on the position of the photoelectrically converted image of the wafer mark WM.

On the other hand, light emitted by a reference plate light source 12 Kohler-illuminates a reference plate 14 by a reference plate illumination optical system 13 so as to generate a uniform light amount distribution on the reference plate 14. A reference mark SM is formed on the reference plate 14, and only light transmitted through the reference mark SM is guided to a half mirror 15. The light source 1 which emits alignment light and the reference plate light source 12 which emits reference light are provided as separate light sources to prohibit emission of reference light when the wafer mark WM is illuminated. Also, emission of alignment light is prohibited when the reference mark SM is illuminated to make it possible to form the wafer mark WM and reference mark SM within the same field of view.

An exposure light scope (not shown) detects the relative position between a mark formed on a wafer stage and a mark formed on a reticle. After that, the so-called baseline is measured by detecting the relative position between the mark on the wafer stage and the reference mark SM by the OA detection system. The reference mark SM serves as a reference of the OA detection system in measuring the baseline. After the baseline is measured, the position of the wafer mark WM is detected with reference to the reference mark SM.

There exists a phenomenon in which the measurement value, that is, the detection position of the alignment mark horizontally varies from the optical axis depending on the Z position in the focus direction as the position in the optical axis direction of the OA detection system, and this variation turns into alignment measurement error components of, for example, the OA detection system. This characteristic in which the detection position horizontally varies from the optical axis will be referred to as a "defocus characteristic" hereinafter.

A defocus characteristic will be explained below with reference to FIGS. 2A and 2B. As shown in FIG. 2A, when the incident angle of the illumination light on the wafer tilts with respect to the wafer, the measurement value of the position of the alignment mark deviates by $\Delta 1$ at a defocus of +D [μm] on the plus side or by $\Delta 2$ at a defocus of –D [μm] on the minus side. Therefore, the measurement value of the alignment mark depends on the amounts of defocus by:

Plus Side: $\Delta 1$/+D Per 1-μm Defocus
Minus Side: $\Delta 2$/–D Per 1-μm Defocus To suppress this defocus characteristic, it is necessary to bring the incident angle of the illumination light on the wafer W close to zero, as shown in FIG. 2B. If the OA detection system measures the alignment mark while exhibiting such a defocus characteristic, a variation in position of the alignment mark in the Z direction turns into that in the measurement direction, and this deteriorates the measurement reproducibility. To combat this situation, it is a conventional practice to prevent generation of any defocus characteristic as much as possible by adjusting the optical axis of the detection light or that of the illumination light, as described in Japanese Patent Laid-Open No. 10-022211.

Japanese Patent Laid-Open No. 10-022211 adjusts the defocus characteristic of a reference mark and detects the position of a mark to be actually aligned, which is assumed to have a defocus characteristic equal to that of the reference mark.

Also, an alignment mark on a wafer is measured by selecting one of a plurality of illumination conditions in order to perform the measurement in conformity with the manufacturing process conditions such as the type and thickness of a resist applied on the wafer. Moreover, an alignment detection system is configured such that the illumination conditions such as the detection wavelength and the NA are variable so as to allow detection with high accuracy for even various kinds of alignment marks corresponding to the conditions involved. More specifically, the wavelength range of the illumination light or the NA of the projection optical system is typically adopted as the illumination condition. In this case, a method of measurement by selecting wavelengths conforming to the conditions involved from a plurality of types of wavelength ranges is employed.

These conventional methods use a plurality of aperture stops and a plurality of light sources to change the illumination condition. A plurality of types of illumination conditions are set by combining these aperture stops and light sources, so it is necessary to reduce measurement errors (defocus characteristic) upon defocusing attributed to the tilt of the optical axis for all these illumination conditions (Japanese Patent Laid-Open Nos. 2003-142375 and 2004-356193).

To meet this requirement, it is necessary to adjust a displacement (decentering) of an aperture stop for an illumination system with respect to an aperture stop for a detection system (corresponding to an aperture stop for an imaging system). One proposed method adjusts the displacement by driving a mechanism which switches between the plurality of aperture stops for the illumination system and these aperture stops for the illumination system in two orthogonal directions to adjust their positions.

Note that the plurality of aperture stops for the illumination system are switched by a driving system. In one example, the driving system has an arrangement in which the patterns of the plurality of aperture stops for the illumination system are formed in a glass disk, and the disk is rotationally driven by a motor, thereby positioning an appropriate one of these aperture stops on the optical axis. The motor used is a pulse motor and a photo-switch is used to detect the origin of the glass disk having the stop patterns formed in it. Because the plurality of aperture stops for the illumination system are switched or adjusted using the driving system, a considerable amount of driving error naturally occurs. For this reason, the defocus characteristic may inevitably remain to some extent in an actual detection system due to the foregoing factors.

There is another problem that the defocus characteristic changes depending on the illumination condition and therefore cannot always be reduced for all wafers. This poses a problem that deterioration in alignment measurement accuracy occurs for certain wafers (especially wafers in different processes) due to the remaining defocus characteristic and a variation in position of the alignment mark in the Z direction, and this, in turn, deteriorates the overlay accuracy.

Japanese Patent Laid-Open No. 2005-026461 proposes another method of adjusting the above-mentioned defocus characteristic. This method observes both an aperture stop for an illumination system and an aperture stop for an imaging system, which are mounted in a position detection apparatus, thereby adjusting decentering of the aperture stop for the illumination system with respect to the aperture stop for the imaging system.

In the first embodiment of Japanese Patent Laid-Open No. 2005-026461, both an aperture stop for an illumination system and an aperture stop for an imaging system are observed at once by switching the aperture stop for the illumination system, from the one which satisfies $\sigma<1$ to the one which satisfies $\sigma \geq 1$, thereby adjusting decentering of the aperture stop for the illumination system with respect to the aperture stop for the imaging system. Note that σ is the ratio ((Diameter of Aperture Stop for Illumination System)/(Diameter of Aperture Stop for Imaging System)) of the diameter of the aperture stop for the illumination system to that of the aperture stop for the imaging system, which takes the imaging magnification into consideration at the position of the aperture stop for the imaging system. For this reason, after the aperture stop for the illumination system, which satisfies $\sigma \geq 1$, is adjusted, it is necessary to switch the aperture stop for the illumination system again to the one which satisfies $\sigma<1$ for use in mark measurement. It is therefore impossible to compensate for errors attributed to this switching. Furthermore, a diffusing plate is inserted in the optical path to satisfy σ≧1 in the second embodiment of Japanese Patent Laid-Open No. 2005-026461, resulting in complication of the apparatus.

SUMMARY OF THE INVENTION

The present invention reduces the adverse influence of a displacement between, for example, an aperture stop for an illumination system and an aperture stop for an imaging system.

According to the present invention, there is provided a position detection apparatus that detects a position of an object to be detected based on a position of an image of a mark, the apparatus comprising: an imaging system configured to form an image of the mark formed on the object; an illumination system configured to illuminate the mark with illumination light emitted by a light source via a part of the imaging system, the illumination system including a rotary table having a first aperture stop for the illumination system and a second aperture stop for the illumination system, both of which can be positioned on a pupil plane of the illumination system in an optical path of the illumination light between an aperture stop for the imaging system and the light source by rotating the rotary table; a first image sensor configured to detect the image of the mark formed by the imaging system; a second image sensor configured to sense an image of the aperture stop for the imaging system and an image of the first aperture stop; and a controller, wherein the controller causes the second image sensor to sense an image of the aperture stop for the imaging system using the illumination light having passed through the second aperture stop positioned on the pupil plane, positions the first aperture stop on the pupil plane by rotating the rotary table and causes the second image sensor to sense an image of the first aperture stop using the illumination light having passed through the first aperture stop, and performs, a process of correcting the first aperture stop so as to reduce an adverse influence of a displacement of the first aperture stop with respect to the aperture stop for the imaging system, based on the sensed image of the aperture stop for the imaging system and the sensed image of the first aperture stop, and the position detection apparatus detects the position of the object using the illumination light having passed through the first aperture stop having undergone the correcting process.

Further features of the present invention will become apparent from the following description of exemplary embodiments with reference to the attached drawings.

DESCRIPTION OF THE EMBODIMENTS

Figure 1:
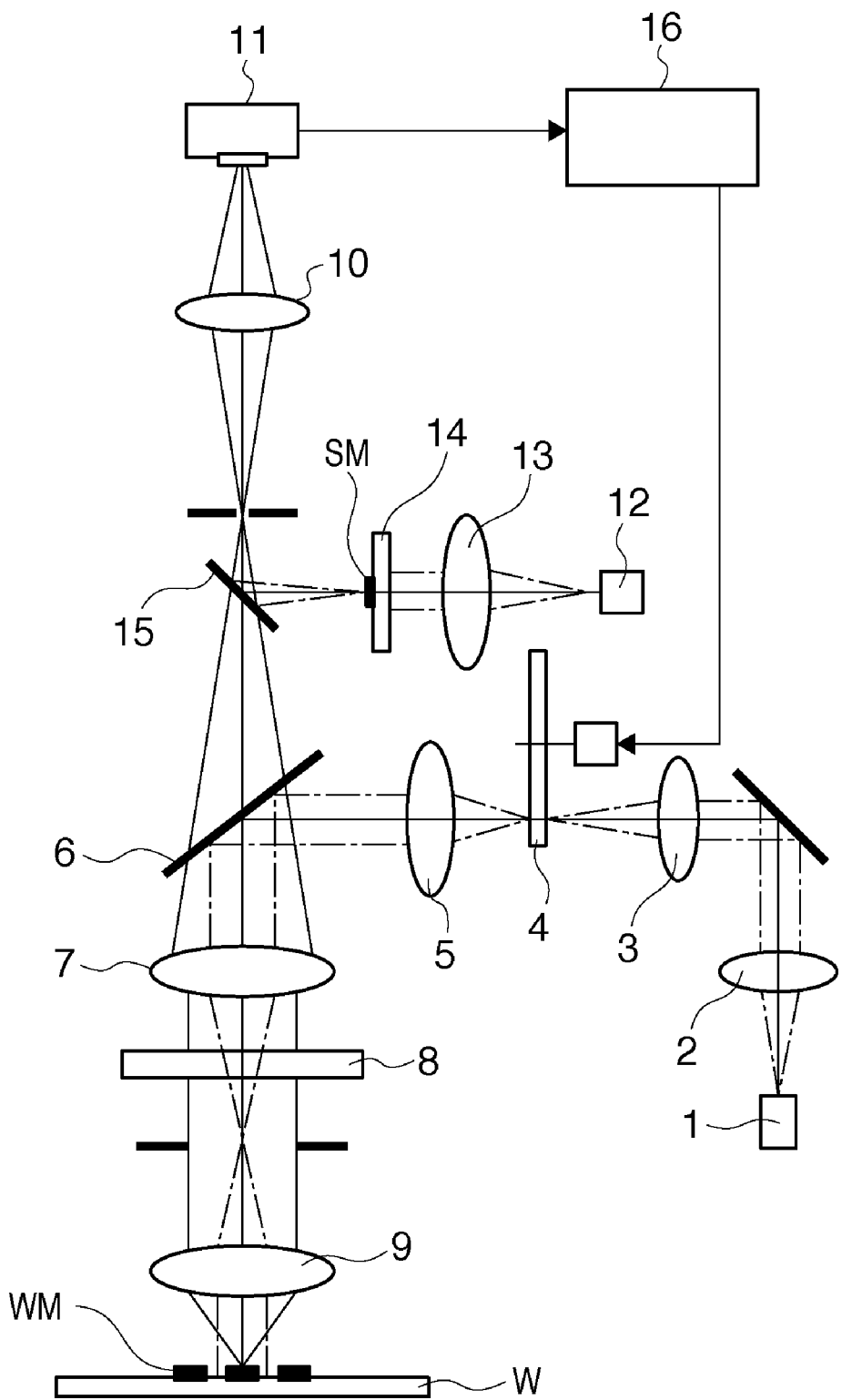
FIG. 1 is a view showing a conventional off-axis autoalignment detection system.
Figure 2A:
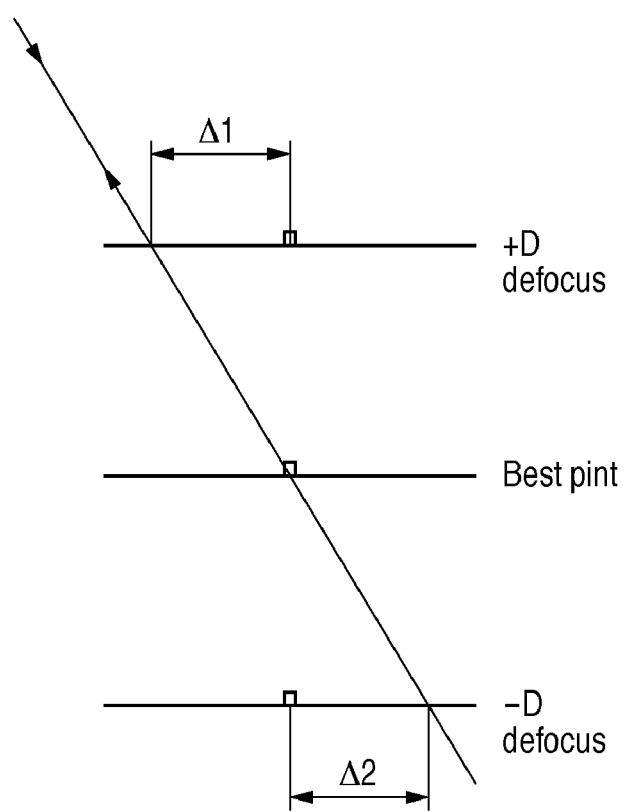
FIGS. 2A and 2B are explanatory views of the defocus characteristic.
Figure 2B:
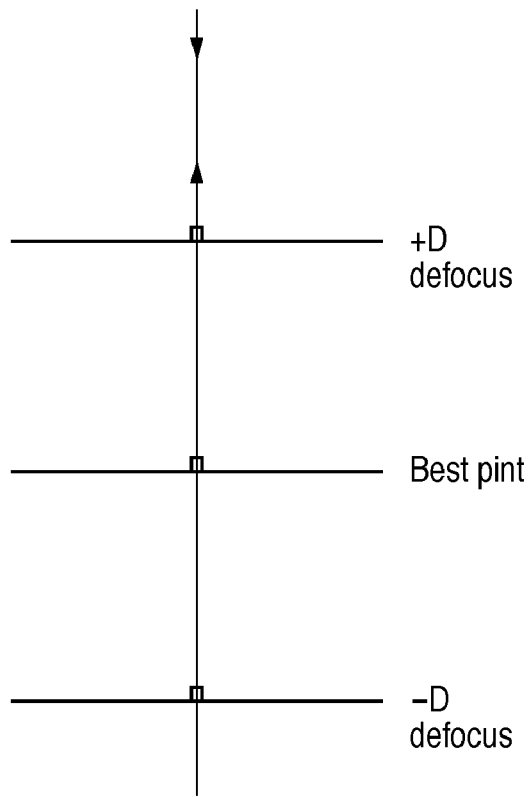

An exposure apparatus including an off-axis autoalignment detection system (OA detection system) according to one aspect of the present invention will be described below with reference to the accompanying drawings. Note that the same reference numerals denote the same members throughout the drawings.

Figure 3:
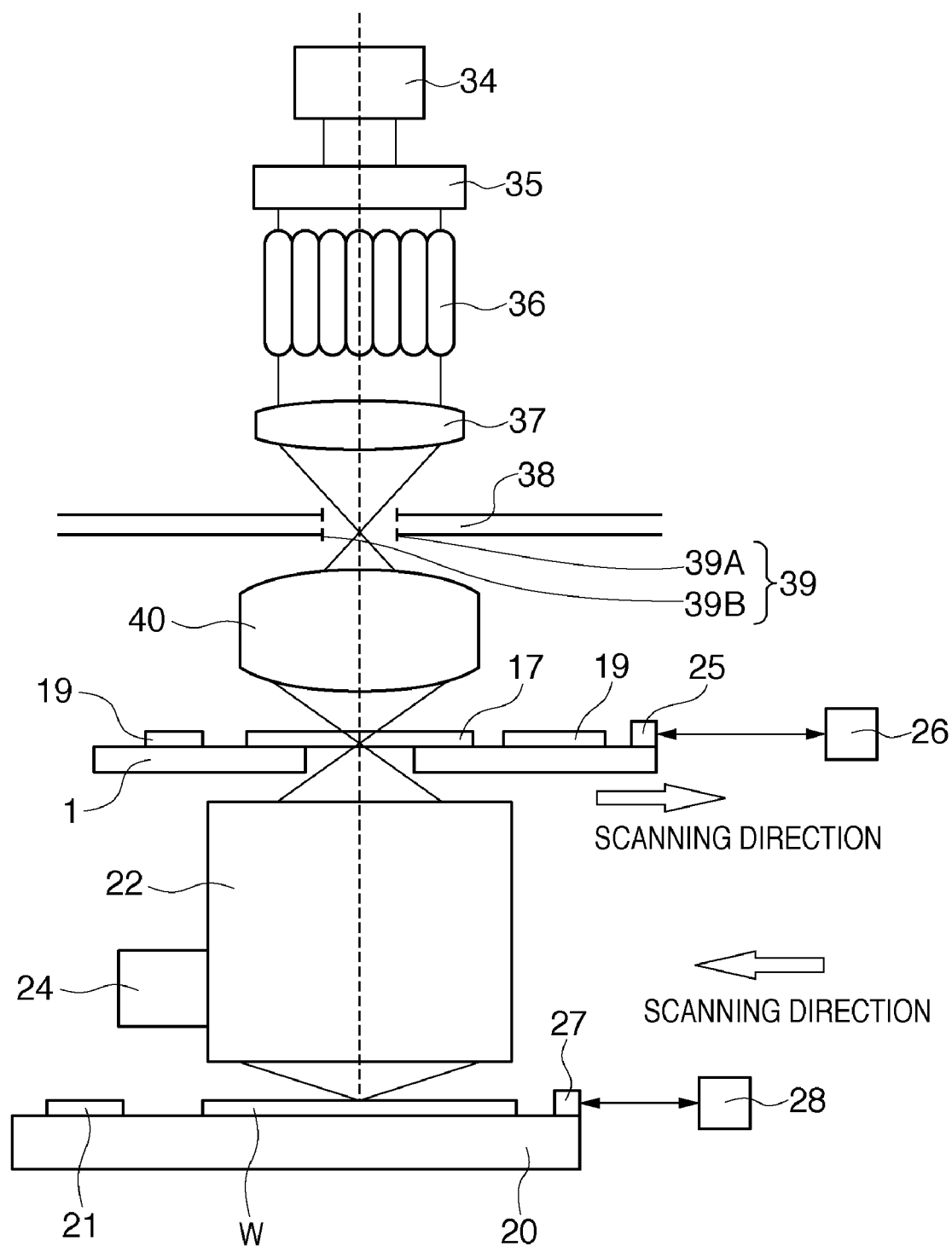
FIG. 3 is a view showing an exposure apparatus that mounts a position detection apparatus according to the present invention.

FIG. 3 is a schematic view showing one exemplary arrangement of an exposure apparatus including an OA detection system according to one aspect of the present invention. The exposure apparatus images and projects the pattern of a mask (reticle) 17 onto a wafer W serving as a substrate via a projection optical system 22. A light source 34 emits illumination light in a predetermined wavelength range. The illumination light emitted by the light source 34 becomes incident on and is guided by an illumination optical system which illuminates the mask 17. The illumination optical system includes an optical system 35 for shaping the illumination light, a fly-eye lens 36, a condenser lens 37, a fixed field stop 38, a variable field stop 39, and a relay lens system 40. An image of the circuit pattern of the mask 17 within a slit-like illumination region is transferred onto the wafer W via the projection optical system 22.

The light source 34 can be, for example, an excimer laser light source such as an ArF excimer laser or KrF excimer laser light source, a metal vapor laser light source, a pulsed light source such as a high-frequency generator which employs a YAG laser, or a continuous light source such as a combination of a mercury lamp and an elliptic reflecting mirror.

Exposure is switched on/off by controlling power supplied from a pulsed light source power supply if a pulsed light source is adopted, whereas it is switched on/off by a shutter in the optical system for shaping the illumination light if a continuous light source is adopted. In this embodiment, since the variable field stop 39 is set as a movable blind, exposure may be switched on/off by opening/closing the movable blind.

The illumination light from the light source 34 has its beam size set to a predetermined size by the optical system for shaping the illumination light, and reaches the fly-eye lens 36. A large number of secondary light sources are formed on the exit surface of the fly-eye lens 36, and the illumination light from these secondary light sources is converged by the condenser lens 37 and reaches the variable field stop 39 via the fixed field stop 38.

Although the fixed field stop 38 is positioned closer to the condenser lens 37 than the variable field stop 39 in this embodiment, it may be positioned closer to the relay lens system 40 than the variable field stop 39. The fixed field stop 38 has a rectangular slit-like aperture formed in it, and the light having passed through the fixed field stop 38 changes into light having a rectangular slit-like cross-section and is incident on the relay lens system 40. The slit longitudinal direction is a direction perpendicular to the paper surface in FIG. 3.

The relay lens system 40 sets the variable field stop 39 to be conjugate to the pattern forming surface of the mask 17. The wafer W is placed on a wafer stage 20 by a wafer transport device (not shown).

The wafer stage 20 includes, for example, an X-Y stage which positions the wafer W within a plane perpendicular to the optical axis of the projection optical system 22 and scans the wafer W in the ±Y directions, and a Z stage which positions the wafer W in the Z direction. An off-axis autoalignment detection system (OA detection system) 24 is located above the wafer W.

A method of measuring the baseline will be explained next with reference to FIG. 4. A mask stage 18 can move while holding the mask 17. The mask 17 is placed on the mask stage 18, and a mask reference mark 33 serving as a reference to position the mask 17 and mask stage 18 is formed on the mask stage 18. The mask 17 is aligned with the mask reference mark 33 using a mask alignment microscope (not shown).

Figure 4:
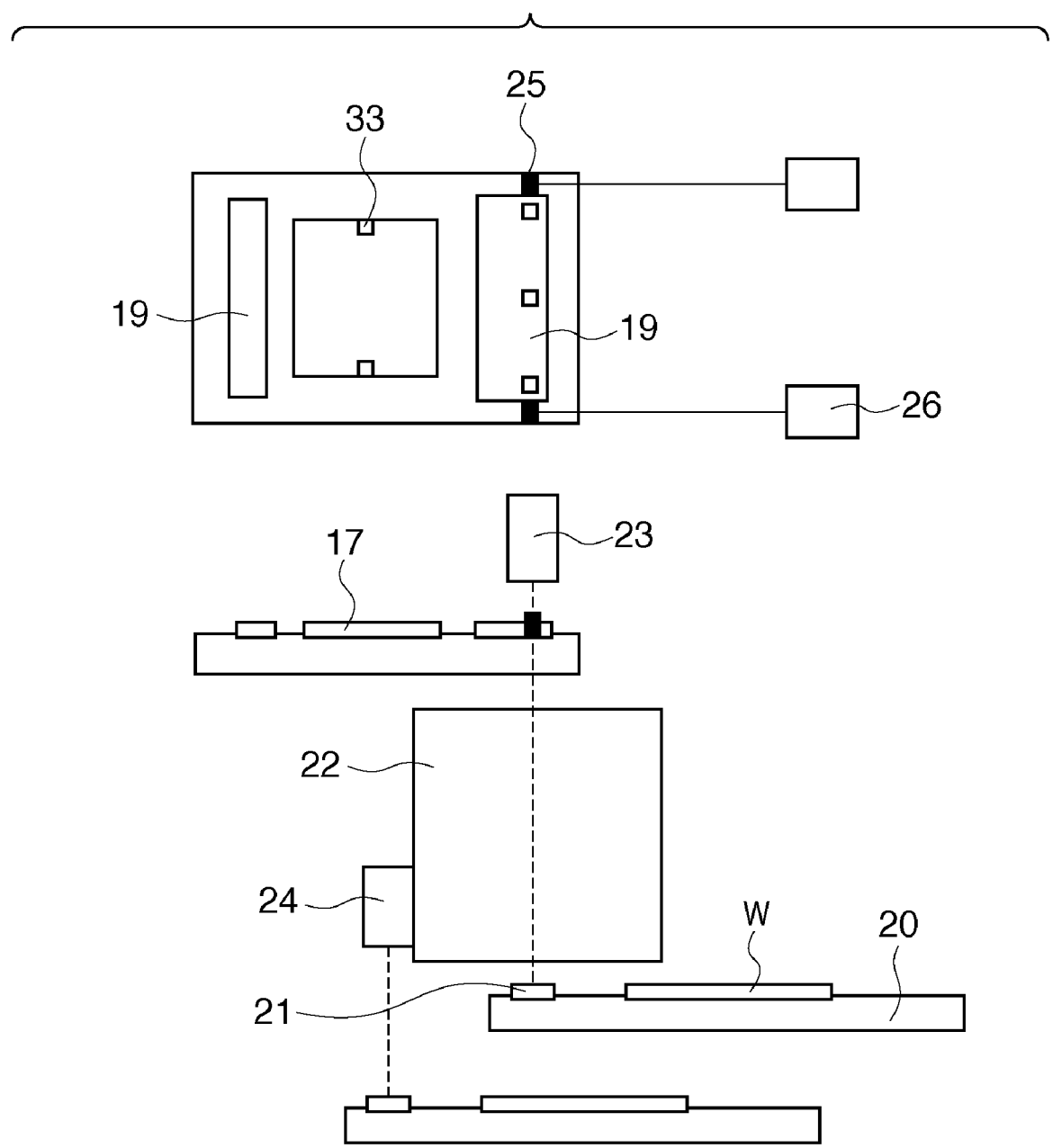
FIG. 4 is a view showing the vicinity of a mask stage in FIG. 3.

As shown in FIG. 4, the relative position between a baseline measurement mark formed on the mask 17 and a mark formed on a stage reference mark 21 fixed on the wafer stage 20 is detected through the projection optical system 22 using an alignment microscope 23 (first process).

After the first process is completed, the wafer stage 20 is moved to move the stage reference mark 21 into the observation field of the OA detection system 24. The relative position between the mark formed on the stage reference mark 21 and a reference mark SM of the OA detection system 24 is detected (second process).

The amount of baseline is calculated based on the detection results obtained in the first and second processes. With this operation, the detection position of the OA detection system 24 with respect to the exposure drawing center is obtained. Exposure can be started after the wafer W as a substrate is positioned.

The OA detection system 24 serves as a position detection apparatus which detects, by a first image sensor, an image of the mark formed on the wafer stage 20 as an object to be detected, and detects the position of the wafer stage 20 based on the position of the detected image of the mark.

First Embodiment

Next, a method of measuring an aperture stop for an illumination system and an aperture stop for an imaging system in a position detection apparatus will be explained.

Figure 5:
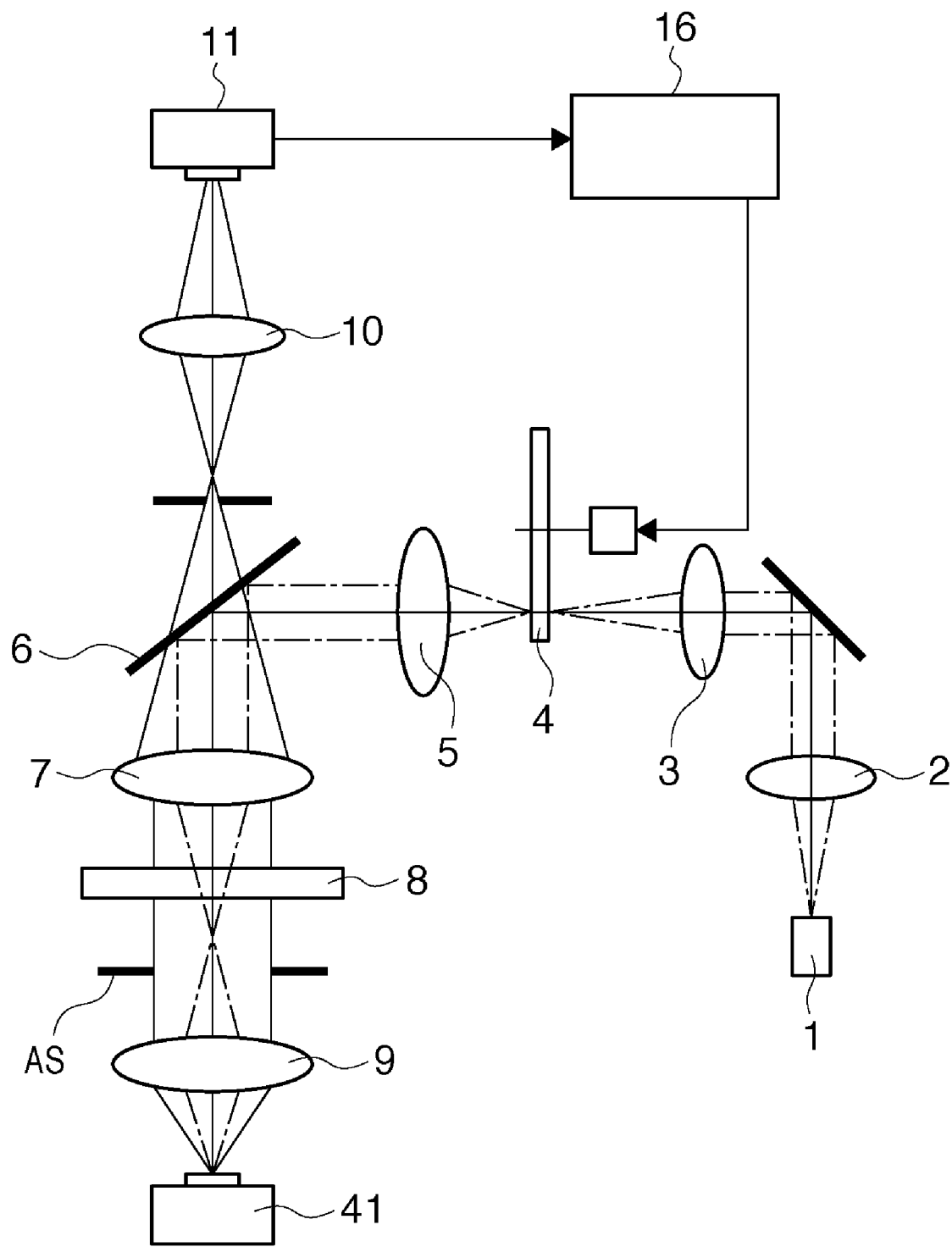
FIG. 5 is a view showing a position detection apparatus and a second image sensor.

FIG. 5 is a schematic view showing a position detection apparatus according to one embodiment of the present invention. Light guided from a light source 1 passes through illumination relay optical systems 2 and 3 and forms an image in an aperture stop for an illumination system, which is formed in a rotary table 4. Specific light having passed through the aperture stop for the illumination system further passes through an illumination optical system 5 and is guided to a polarizing beam splitter 6. S-polarized light reflected by the polarizing beam splitter 6 passes through a relay lens 7 and λ/4 plate 8, is converted into circularly polarized light, and Kohler-illuminates a wafer mark WM, formed on a wafer W positioned at the position of a sensor 41, upon passing through an objective lens 9. Reflected light, diffracted light, and scattered light generated by the wafer mark WM travel back through the objective lens 9, λ/4 plate 8, and relay lens 7. The resultant light is then converted into P-polarized light, passes through the polarizing beam splitter 6, and forms an image of the wafer mark WM on a sensor (first image sensor) 11 by an imaging optical system 10.

The light source 1, the illumination relay optical systems 2 and 3, the rotary table 4 having aperture stops for the illumination system, the illumination optical system 5, the polarizing beam splitter 6, the relay lens 7, the λ/4 plate 8, and the objective lens 9 constitute an illumination system which guides illumination light emitted by a light source. Also, the objective lens 9, λ/4 plate 8, relay lens 7, polarizing beam splitter 6, and imaging optical system 10 constitute an imaging system which forms an image of a mark. The illumination system illuminates the mark with some components of the imaging system, such as the relay lens 7, λ/4 plate 8, and objective lens 9.

Referring to FIG. 5, reference symbol AS denotes an aperture stop for the imaging system. Reference numeral 41 denotes a sensor that senses an image of the aperture stop for the illumination system and that of the aperture stop AS for the imaging system. The sensor 41 is positioned on the side of an object to be detected. The sensor 41 can be positioned anywhere as long as it can sense images of the pupil planes of the aperture stop for the illumination system and the aperture stop for the imaging system. The sensor 41 serves as a second image sensor which senses an image of the aperture stop for the imaging system and that of a first aperture stop for the illumination system, and detects the amount of displacement of the first aperture stop for the illumination system with respect to the aperture stop for the imaging system.

Figure 6:
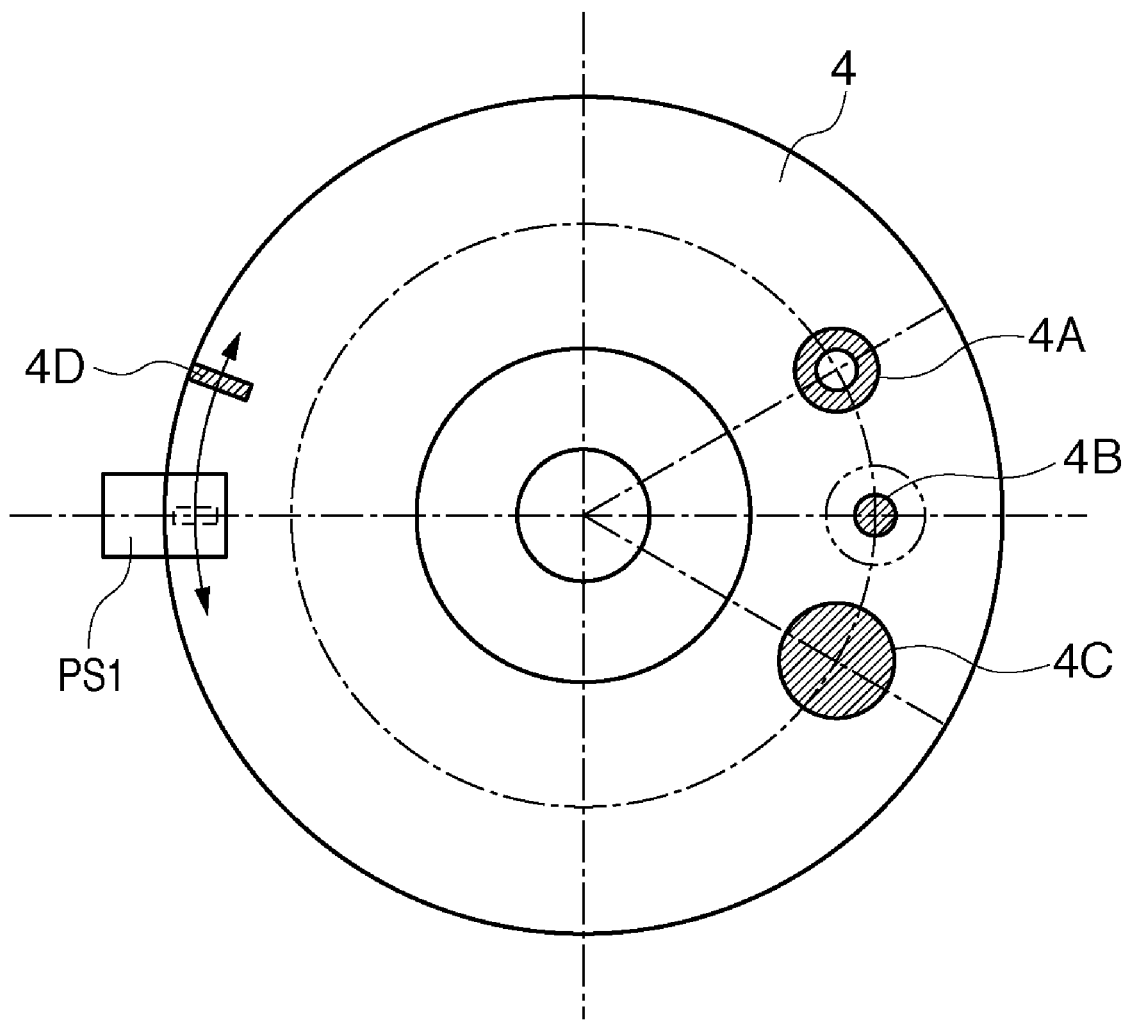
FIG. 6 is a view showing a rotary table.

FIG. 6 shows details of the rotary table 4 having the aperture stops for the illumination system. A plurality of aperture stops 4A to 4C are formed in the rotary table 4, as described above. Illumination light emitted by the light source 1 passes through one of the plurality of types of aperture stops 4A to 4C for the illumination system, which are formed in the rotary table 4 via the illumination relay optical systems 2 and 3. The aperture stops 4A to 4C for the illumination system can be switched between each other by the rotary scheme (turret scheme) by driving the rotary table 4 using, for example, a motor.

The rotation origin of the motor is obtained by rotating the motor for origin detection in advance. As for an origin detection method, the position where a slit 4D formed in the rotary table 4 passes through a detection unit of a photo-switch PS1 is determined as a rotation origin. Letting σ be the value obtained by converting the aperture diameter of each aperture stop for the illumination system into that of the aperture stop for the imaging system by taking the imaging magnification into consideration, the aperture stops 4A and 4B for the illumination system satisfy σ<1, whereas the aperture stop 4C for the illumination system satisfies σ>1. The aperture stops 4A and 4B for the illumination system, which satisfy σ<1, are actually used to measure the object, whereas the aperture stop 4C for the illumination system, which satisfies σ>1, is used for adjustment.

The aperture stops 4A and 4B for the illumination system, which satisfy σ<1, serve as a plurality of first aperture stops for the illumination system in the rotary table 4, whereas the aperture stop 4C for the illumination system for use in adjustment, which satisfies σ>1, serves as a second aperture stop for the illumination system. The aperture stops 4A, 4B, and 4C for the illumination system each can be positioned on the pupil plane of the illumination system in the optical path of the illumination light between the aperture stop AS for the imaging system and the light source by rotating the rotary table 4.

A method of measuring the positions of the aperture stop AS for the imaging system and the aperture stop for the illumination system using the above-mentioned different types of aperture stops will be explained next. First, the sensor 41 senses an image of the aperture stop AS for the imaging system using the illumination light having passed through the aperture stop AS for the imaging system, which is positioned on the pupil plane of the illumination system. Next, the aperture stop 4B for the illumination system, which is used to measure the object, is positioned on the pupil plane of the illumination system by rotating the rotary table 4, and the sensor 41 senses an image of the aperture stop 4B for the illumination system. The aperture stop 4C for the illumination system, which satisfies σ>1, is used to measure the aperture stop AS for the imaging system, as described above.

Figure 7A:
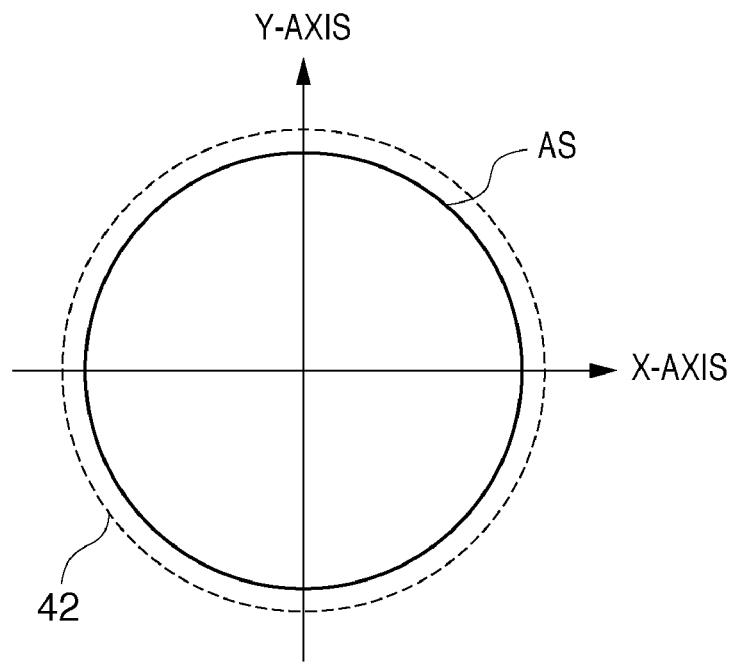
FIGS. 7A and 7B are diagrams showing the positional relationship between an aperture stop for an illumination system and an aperture stop for an imaging system in the pupil plane.
Figure 7B:
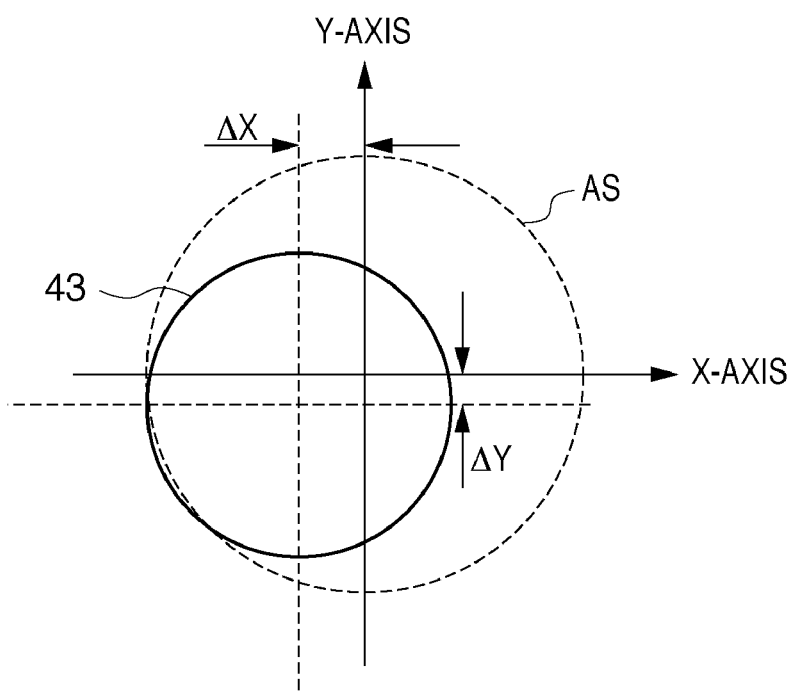

FIGS. 7A and 7B show the results of sensing images of the aperture stop AS for the imaging system and the aperture stop 4B for the illumination system by the sensor 41 in accordance with the above-mentioned method. FIG. 7A shows the result of sensing an image of the aperture stop AS for the imaging system. FIG. 7B shows the result of sensing an image of the aperture stop 4B for the illumination system, which is actually used to measure the object. Reference numeral 42 denotes an image of the aperture stop AS for the imaging system on the sensor; and 43, an image of the aperture stop 4B for the illumination system on the sensor. FIG. 7A adopts an X-Y coordinate system to match that which is defined by the measurement direction of the position detection apparatus assuming the center of the image 42 as an origin.

In this case, the image sensing results reveal the positional relationship between the image 42 of the aperture stop AS for the imaging system and the image 43 of the aperture stop 4B for the illumination system: the center of the aperture stop 4B for the illumination system is displaced by ΔX and ΔY with respect to that of the aperture stop AS for the imaging system, as shown in FIG. 7B. The aperture stop AS for the imaging system and the aperture stop 4B for the illumination system can be adjusted based on these displacements ΔX and ΔY. Although FIG. 7B shows the image of the aperture stop AS for the imaging system, only the image 43 corresponding to the aperture stop 4B for the illumination system can be actually sensed. In other words, if σ<1, the image of the aperture stop AS for the imaging system cannot be sensed but the image 43 of the aperture stop 4B for the illumination system can be sensed. In contrast, if σ>1, the image of the aperture stop AS for the imaging system can be sensed.

Second Embodiment

Figure 8:
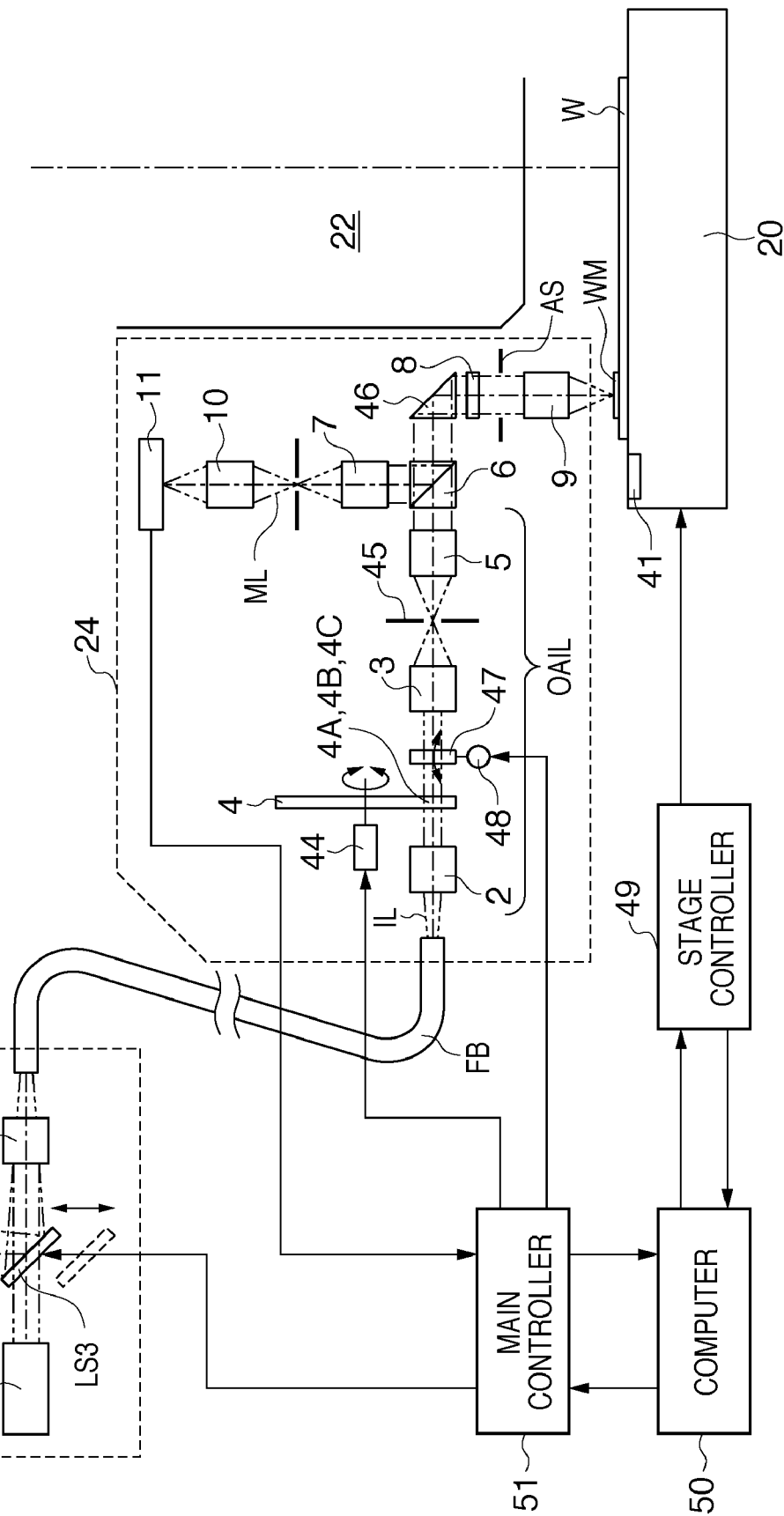
FIG. 8 is a block diagram showing a position detection apparatus accommodated in an exposure apparatus according to the second embodiment.

FIG. 8 is a schematic block diagram showing the main part of an exposure apparatus including a position detection apparatus according to one embodiment of the present invention. FIG. 8 shows an OA detection system 24 of the position detection apparatus at the center. Reference numeral 22 denotes a projection optical system. The OA detection system 24 according to this embodiment accommodates a mechanism which automatically performs a process of correcting an aperture stop 4B for an illumination system so as to reduce the adverse influence of a displacement of the aperture stop 4B for the illumination system with respect to an aperture stop AS for the foregoing imaging system.

A light source unit LS accommodates a HeNe laser LS1 and halogen lamp LS2 that are exothermic bodies, and therefore is spaced apart from the OA detection system 24 that requires temperature stability. The light source unit LS also accommodates a light source switching mirror LS3 and an optical system LS4 which focuses light from the light source on the entrance end of a fiber FB.

A main controller 51 drives the light source switching mirror LS3 in accordance with whether a computer 50 instructs it to use the HeNe laser LS1 or the halogen lamp LS2 as the light source. That is, if the HeNe laser LS1 is selected as the light source, the light source switching mirror LS3 retracts from the optical path, as indicated by a broken line in FIG. 8, and light from the HeNe laser LS1 is focused on the entrance end of the fiber FB via the optical system LS4. If the halogen lamp LS2 is selected as the light source, light from the halogen lamp LS2 is reflected by the light source switching mirror LS3 and focused on the entrance end of the fiber FB via the optical system LS4. The HeNe laser LS1 and halogen lamp LS2 may be interchanged, as a matter of course.

Illumination light IL for the OA detection system 24 is guided from the light source unit LS by the fiber FB connected to an illumination system GAIL of the OA detection system 24. The illumination light IL from the exit end of the fiber FB passes through one of a plurality of types of aperture stops 4A, 4B, and 4C for the illumination system, which are formed in a rotary table 4, via illumination relay optical systems 2 and 3. When an illumination condition defined by a combination of the type of light source (HeNe laser LS1 or halogen lamp LS2) and the aperture stop for the illumination system is set, the computer 50 sends to the main controller 51 the amount of rotation from the rotation origin of a motor 44. The rotation origin of the motor 44 is obtained by rotating the motor 44 for origin detection in advance.

The main controller 51 sets one of the aperture stops 4A, 4B, and 4C for the illumination system to pass the illumination light IL by driving the motor 44 in accordance with the instructed amount of rotation. The illumination light IL having passed through the aperture stop for the illumination system is transmitted through a transparent parallel plate 47 for use in an optical path shift. The parallel plate 47 is positioned near the pupil plane, that is, near the aperture stop for the illumination system, and its tilt with respect to the illumination light IL can be adjusted by driving it using a motor 48.

When an illumination condition is set, the computer 50 sends to the main controller 51 the amount of rotation from the rotation origin of the motor 48. The rotation origin of the motor 48 is obtained by rotating the motor 48 for origin detection in advance. The main controller 51 drives the motor 48 in accordance with the instructed amount of rotation, and the parallel plate 47 parallelly shifts the illumination light IL in the W direction as it has a given tilt with respect to the optical axis of the illumination light IL.

The illumination light IL irradiates an illumination field stop 45 via the illumination condenser lens 3. The illumination light IL emerging from the illumination field stop 45 is transmitted through an illumination optical system 5 and strikes a polarizing beam splitter 6. Of the illumination light IL, a P-polarized component (a component parallel to the paper surface (V-direction component)) is transmitted through the polarizing beam splitter 6. Since the polarizing beam splitter 6 is used to detect the detection light with high efficiency, it may be a typical half mirror as long as it poses no problem associated with the light amount. The illumination light IL transmitted through the polarizing beam splitter 6 is reflected downward by a reflecting prism 46 toward a wafer W. A λ/4 plate 8 is positioned below the reflecting prism 46. The illumination light IL transmitted through the λ/4 plate 8 is converted into circularly polarized light and illuminates a wafer mark WM to be detected on the wafer W via the aperture stop AS for the imaging system and an objective lens 9.

The wafer W is held on a wafer stage 20 which can be driven in the X, Y, and Z directions and the rotation directions about the X-, Y-, and Z-axes. The wafer stage 20 can be driven by a stage controller 49 in accordance with an instruction from the computer 50.

Imaging light ML generated upon reflection, diffraction, and scattering by the wafer mark WM is transmitted through the objective lens 9, the aperture stop AS for the imaging system, and the λ/4 plate 8. The imaging light ML transmitted through the λ/4 plate 8 is converted from circularly polarized light into linearly polarized light (S-polarized light) in a direction (W direction) perpendicular to the paper surface. The imaging light ML is guided to the polarizing beam splitter 6 via the reflecting prism 46 and reflected by the polarizing beam splitter 6 toward a relay lens 7. The relay lens 7 temporarily forms an image of the wafer mark WM. After that, a detection optics 10 forms an image of the wafer mark WM again on the light-receiving surface of a sensor (first image sensor) 11. The wafer mark signal detected by the sensor 11 is input to the computer 50 via the main controller 51. The computer 50 calculates the position of the wafer W based on the received wafer mark signal and the position of the wafer stage 20. The stage controller 49 drives the wafer stage 20 based on the obtained calculation result to align the wafer W.

A method of calculating the amount of adjustment instructed by the computer 50 in order to adjust the parallel plate 47 and the rotary table 4 having the aperture stops for the illumination system will be explained subsequently. The computer 50 determines this amount of adjustment such that the defocus characteristic of the OA detection system 24 is minimized. To do this, the defocus characteristic under each illumination condition is measured in advance.

The procedure for measuring the defocus characteristic is as follows:

1. The wafer stage 20 is driven in the Z direction (the optical axis direction of the projection optical system 22) by −a from a best focus plane.
2. The wafer mark WM is measured and the measurement value is defined as f(−a).
3. The wafer stage 20 is driven in the Z direction by +a from the best focus plane.
4. The wafer mark WM is measured and the measurement value is defined as f(+a).
5. A defocus characteristic $\Delta = \{f(+a) - f(-a)\}/2a$ is calculated.

Although the wafer mark WM is measured at two points in the above-mentioned procedure, it may be measured at more than two points.

The computer 50 calculates and stores the amount of rotation of the rotary table 4 having the aperture stops for the illumination system and the amount of tilt of the parallel plate 47, at both of which the absolute value of $\Delta$ is minimized. When each condition is selected, the computer 50 sends to the main controller 51 the amount of rotation of the rotary table 4 and the amount of tilt of the parallel plate 47, which are stored in itself, and controls the tilt of the optical axis of the illumination light IL on the surface of the wafer W.

Under each condition, the relative position between the aperture stop AS for the imaging system and the aperture stop for the illumination system, which has been described in the first embodiment, is desirably measured and stored when the rotary table 4 and parallel plate 47 are adjusted such that the above-mentioned defocus characteristic is minimized. As described previously, even if the main controller 51 is given an instruction about the amount of rotation of the rotary table 4 and the amount of tilt of the parallel plate 47, which are stored in the computer 50 in advance, and drives these members, the positional relationship between the aperture stop AS for the imaging system and the aperture stop for the illumination system is often not reproduced due to the adverse influence of, for example, driving errors. In this case, the defocus characteristic inevitably deteriorates. Although the above-mentioned defocus characteristic may be measured again to change the illumination condition, this measurement requires a certain period of time and is disadvantageous in throughput. To prevent this, the positional relationship between the aperture stops after the adjustment is stored. With this operation, the defocus characteristic can be minimized by directly measuring and adjusting the aperture stops even when the illumination condition is changed.

Because the rotary table 4, the parallel plate 47, and the aperture stop AS for the imaging system are positioned near the pupil plane serving as the Fourier transform plane of the imaging plane, decentering adjustment of the aperture stop for the illumination system with respect to the aperture stop AS for the imaging system amounts to tilt adjustment of the optical axis of the illumination light IL on the surface of the wafer W. For this reason, the direction to adjust decentering of the aperture stop for the illumination system needs to match the X or Y direction (not shown) of the wafer stage 20 as the direction to measure the wafer mark WM on the wafer W. In other words, the defocus characteristic is adjusted by adjusting the amount of rotation of the rotary table 4 (or adjusting the amount of tilt of the parallel plate 47) so as to bring about an effect only in one of the X and Y directions. This makes it easy to calculate the amount of rotation of the rotary table 4 (or the amount of tilt of the parallel plate 47), at which the defocus characteristic is minimized.

Figure 9A:
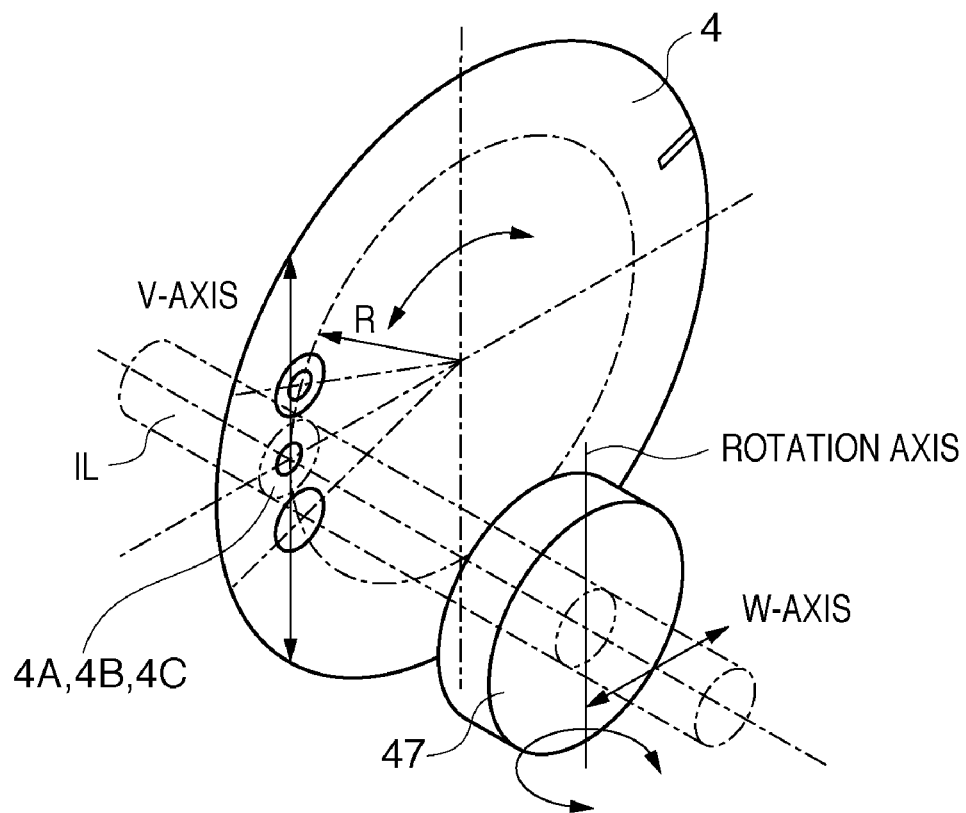
FIGS. 9A and 9B are diagrams showing a method of a process of correcting an aperture stop for an illumination system according to the second embodiment.
Figure 9B:
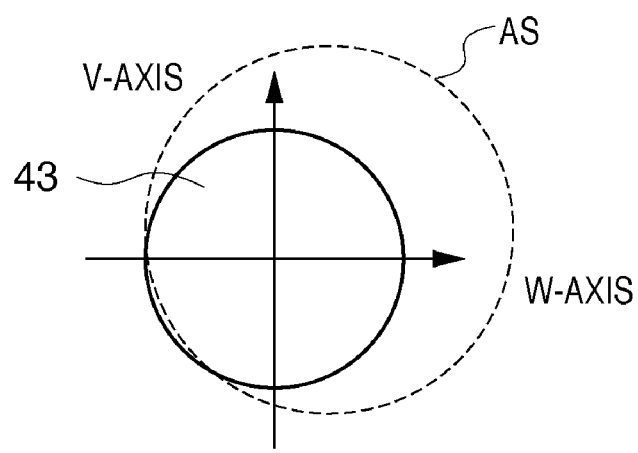

A method of a process of correcting the aperture stop 4B for the illumination system so as to reduce the adverse influence of a displacement of the aperture stop 4B for the illumination system with respect to the aperture stop AS for the imaging system in practice will be explained next with reference to FIGS. 9A and 9B. FIGS. 9A and 9B are schematic diagrams for explaining the functions of the parallel plate 47 and the rotary table 4 having the aperture stops for the illumination system. As shown in FIG. 9A, the aperture stops 4A to 4C for the illumination system are arranged on the circumference of a single circle having the rotation center of the rotary table 4 as a center, and the rotary table 4 is positioned such that the illumination light IL is transmitted through the position where a tangent to the circumference is vertical (or horizontal). Letting R be the radius of the single circle on which the aperture stop 4B for the illumination system is positioned, $\Delta\theta$ be the amount of adjustment of the rotary table 4, and $\Delta V$ and $\Delta W$ be the amounts of decentering of the aperture stop for the illumination system in the V- and W-axis directions, respectively, on the pupil plane for $\Delta\theta$. Then, $\Delta V$ and $\Delta W$ are given by:

$$\Delta V = R \cdot \sin \Delta\theta$$

$$\Delta W = R \cdot (1 - \cos \Delta\theta)$$

The amount of decentering $\Delta W$ can be ignored in a region where $\Delta\theta$ is very small. Hence, when the rotary table 4 is rotated through a very small angle about an axis parallel to the optical axis of the illumination light IL, we can assure that the aperture stop 4B for the illumination system moves in only the V-axis direction perpendicular to the optical axis of the illumination light IL.

Also, when the parallel plate 47 is rotated about the V-axis perpendicular to the optical axis of the illumination light IL, the optical axis of the illumination light IL shifts in the W-axis direction perpendicular to the V-axis direction in which the aperture stop for the illumination system moves. FIG. 9B shows the aperture stops for the imaging system and illumination system in the pupil plane serving as the Fourier transform plane of the imaging plane. The position of the aperture stop 4B for the illumination system relative to that of the circular aperture stop AS for the imaging system is adjusted in the V-axis direction by rotation adjustment of the rotary table 4, and is adjusted in the W-axis direction by tilt adjustment of the parallel plate 47.

The motor 44 rotates the rotary table 4 about an axis parallel to the optical axis of the illumination light. Also, the motor 48 rotates the parallel plate 47 about an axis perpendicular to the optical axis of the illumination light. Controlling the rotation of the rotary table 4 and parallel plate 47 via the motors 44 and 48, respectively, performs a process of correcting the aperture stop for the illumination system. A controller 16 shown in FIG. 5 and the main controller 51 shown in FIG. 8 each function as a controller which performs a process of correcting the aperture stop 4B for the illumination system by causing the sensor 41 to sense images of the aperture stop 4B for the illumination system and the aperture stop AS for the imaging system.

In the second embodiment, a process of correcting the aperture stop for the illumination system is performed by controlling the rotation of the rotary table 4 and parallel plate 47. However, a process of correcting a first aperture stop for the illumination system can also be performed by additionally disposing a parallel plate that is rotatable about an axis perpendicular to both the rotation axis of the parallel plate 47 and the optical axis of the illumination light, and controlling the rotation of a plurality of parallel plates.

The correcting process by controlling the rotation of the rotary table 4 and parallel plate 47 or the rotation of a plurality of parallel plates is performed in response to a change in illumination condition.

Note that the exit end of the fiber FB also serves as a pupil plane. A pupil plane illuminance distribution component attributed to the fact that the illuminance distribution at the exit end of the fiber FB varies when the light source unit LS is switched between the HeNe laser LS1 and the halogen lamp LS2 (the fact that speckles are generated due to factors associated with the HeNe laser) is taken into consideration. In this way, the position of the aperture stop for the illumination system is optimally adjusted such that the defocus characteristic is minimized.

Embodiment of Method of Manufacturing Device

A method of manufacturing a device (e.g., a semiconductor device and a liquid crystal display device) according to one embodiment of the present invention will be explained next. This method can use an exposure apparatus to which the present invention is applied.

A semiconductor device is manufactured by a preprocess of forming an integrated circuit on a wafer (semiconductor substrate), and a post-process of completing, as a product, a chip of the integrated circuit formed on the wafer by the preprocess. The preprocess can include a step of exposing a wafer coated with a photosensitive agent using the above-mentioned exposure apparatus, and a step of developing the wafer. The post-process can include an assembly step (dicing and bonding) and packaging step (encapsulation). Also, a liquid crystal display device is manufactured by a step of forming a transparent electrode. The step of forming a transparent electrode can include a step of coating a glass substrate, on which a transparent conductive film is deposited, with a photosensitive agent, a step of exposing the glass substrate coated with the photosensitive agent using the above-mentioned exposure apparatus, and a step of developing the glass substrate.

The method of manufacturing a device according to this embodiment is more advantageous in at least one of the productivity and quality of devices to the prior arts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-072863, filed Mar. 24, 2009, which is hereby incorporated by reference herein in its entirety.

What is claimed is:

1. A position detection apparatus that detects a position of an object to be detected based on a position of an image of a mark, the apparatus comprising:
    an imaging system configured to form an image of the mark formed on the object;
    an illumination system configured to illuminate the mark with illumination light emitted by a light source via a part of said imaging system, said illumination system including a rotary table having a first aperture stop for said illumination system and a second aperture stop for said illumination system, both of which can be positioned on a pupil plane of said illumination system in an optical path of the illumination light between an aperture stop for said imaging system and the light source by rotating said rotary table;
    a first image sensor configured to detect the image of the mark formed by said imaging system;
    a second image sensor configured to sense an image of the aperture stop for said imaging system and an image of said first aperture stop; and
    a controller,
    wherein said controller
    causes said second image sensor to sense an image of the aperture stop for said imaging system using the illumination light having passed through said second aperture stop positioned on the pupil plane,
    positions said first aperture stop on the pupil plane by rotating said rotary table and causes said second image sensor to sense an image of said first aperture stop using the illumination light having passed through said first aperture stop, and
    performs, a process of correcting said first aperture stop so as to reduce an adverse influence of a displacement of said first aperture stop with respect to the aperture stop for said imaging system, based on the sensed image of the aperture stop for said imaging system and the sensed image of said first aperture stop, and
    the position detection apparatus detects the position of the object using the illumination light having passed through said first aperture stop having undergone the correcting process.

2. The apparatus according to claim 1, wherein
    said illumination system further includes a parallel plate which is rotatable about an axis perpendicular to an optical axis of the illumination light and is configured to transmit the illumination light having passed through said first aperture stop, and
    said controller performs the correcting process by controlling rotation of said rotary table and said parallel plate.

3. The apparatus according to claim 1, wherein
    said illumination system further includes two parallel plates which are respectively rotatable about two orthogonal axes in a plane perpendicular to an optical axis of the illumination light and are configured to transmit the illumination light having passed through said first aperture stop, and said controller performs the correcting process by controlling rotation of said two parallel plates.

4. The apparatus according to claim 1, wherein said first aperture stop in said rotary table includes a plurality of first aperture stops, and said controller performs the correcting process in accordance with said first aperture stop selected from said plurality of first aperture stops.

5. An exposure apparatus that exposes a substrate via a reticle after the substrate is aligned with the reticle, the apparatus comprising:

a position detection apparatus configured to detect a position of the substrate based on a position of an image of a mark for the alignment, said position detection apparatus comprising an imaging system configured to form an image of the mark formed on the substrate, an illumination system configured to illuminate the mark with illumination light emitted by a light source via a part of said imaging system, said illumination system including a rotary table having a first aperture stop for said illumination system and a second aperture stop for said illumination system, both of which can be positioned on a pupil plane of said illumination system in an optical path of the illumination light between an aperture stop for said imaging system and the light source by rotating said rotary table, a first image sensor configured to detect the image of the mark formed by said imaging system, a second image sensor configured to sense an image of the aperture stop for said imaging system and an image of said first aperture stop, and a controller, wherein said controller causes said second image sensor to sense an image of the aperture stop for said imaging system using the illumination light having passed through said second aperture stop positioned on the pupil plane, positions said first aperture stop on the pupil plane by rotating said rotary table and causes said second image sensor to sense an image of said first aperture stop using the illumination light having passed through said first aperture stop, and performs, a process of correcting said first aperture stop so as to reduce an adverse influence of a displacement of said first aperture stop with respect to the aperture stop for said imaging system, based on the sensed image of the aperture stop for said imaging system and the sensed image of said first aperture stop, and the position detection apparatus detects the position of the substrate using the illumination light having passed through said first aperture stop having undergone the correcting process.

6. A method of manufacturing a device, the method comprising:

exposing a substrate to radiant energy via a reticle using an exposure apparatus;

developing the exposed substrate; and processing the developed substrate to manufacture the device, wherein the exposure apparatus exposes a substrate via a reticle after the substrate is aligned with the reticle, and comprises a position detection apparatus configured to detect a position of the substrate based on a position of an image of a mark for the alignment, the position detection apparatus comprises an imaging system configured to form an image of the mark formed on the substrate, an illumination system configured to illuminate the mark with illumination light emitted by a light source via a part of the imaging system, the illumination system including a rotary table having a first aperture stop for the illumination system and a second aperture stop for the illumination system, both of which can be positioned on a pupil plane of the illumination system in an optical path of the illumination light between an aperture stop for the imaging system and the light source by rotating the rotary table, a first image sensor configured to detect the image of the mark formed by the imaging system, a second image sensor configured to sense an image of the aperture stop for the imaging system and an image of the first aperture stop, and a controller, the controller causes the second image sensor to sense an image of the aperture stop for the imaging system using the illumination light having passed through the second aperture stop positioned on the pupil plane, positions the first aperture stop on the pupil plane by rotating the rotary table and causes the second image sensor to sense an image of the first aperture stop using the illumination light having passed through the first aperture stop, and performs, a process of correcting the first aperture stop so as to reduce an adverse influence of a displacement of the first aperture stop with respect to the aperture stop for the imaging system, based on the sensed image of the aperture stop for the imaging system and the sensed image of the first aperture stop, and the position detection apparatus detects the position of the substrate using the illumination light having passed through the first aperture stop having undergone the correcting process.

* * * * *